United States Patent
Krvavac

(10) Patent No.: US 6,819,180 B2
(45) Date of Patent: Nov. 16, 2004

(54) RADIO FREQUENCY POWER AMPLIFIER ADAPTIVE BIAS CONTROL CIRCUIT

(75) Inventor: Enver Krvavac, Lake Zurich, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/460,492

(22) Filed: Jun. 12, 2003

(65) Prior Publication Data

US 2004/0095193 A1 May 20, 2004

Related U.S. Application Data

(63) Continuation-in-part of application No. 10/294,138, filed on Nov. 14, 2002, now abandoned.

(51) Int. Cl.[7] .............................. H03G 3/10; H03G 3/20
(52) U.S. Cl. ........................ 330/285; 330/129; 330/140
(58) Field of Search ................................. 330/285, 129, 330/140

(56) References Cited

U.S. PATENT DOCUMENTS

| | | | | |
|---|---|---|---|---|
| 4,250,457 A | * | 2/1981 | Hofmann | 329/349 |
| 5,307,023 A | * | 4/1994 | Schade, Jr. | 330/257 |
| 6,046,642 A | * | 4/2000 | Brayton et al. | 330/296 |
| 6,130,579 A | * | 10/2000 | Iyer et al. | 330/285 |
| 6,172,567 B1 | * | 1/2001 | Ueno et al. | 330/285 |

* cited by examiner

Primary Examiner—Patricia Nguyen
(74) Attorney, Agent, or Firm—Valerie M. Davis

(57) ABSTRACT

An adaptive bias control circuit for use with a radio frequency (RF) power amplifier, the RF power amplifier having an input (112) for receiving an input signal having a varying amplitude, an output (116), a first transistor (110), and a plurality of operating performance characteristics responsive to a quiescent operating point established by a bias current in the RF power amplifier, the bias control circuit having: a first circuit (120) coupled to the RF power amplifier for receiving a portion of the input signal; and a second transistor (122) for generating a rectified signal from the portion of the input signal, the rectified signal for causing the bias current to be controlled as a function of the amplitude of the input signal, the second transistor having a first and second terminal connected together and coupled to the first circuit and a third terminal coupled to a fixed voltage.

13 Claims, 1 Drawing Sheet

RADIO FREQUENCY POWER AMPLIFIER ADAPTIVE BIAS CONTROL CIRCUIT

CROSS-REFERENCE TO RELATED APPLICATIONS

The present application is a continuation in part of pending U.S. patent application Ser. No. 10/294,138 filed Nov. 14, 2002 now abandoned for a RADIO FREQUENCY POWER AMPLIFIER ADAPTIVE BIAS CONTROL CIRCUIT.

FIELD OF THE INVENTION

The present invention relates generally to radio frequency (RF) power amplifiers, and more specifically to a circuit for causing a bias current in the RF power amplifier to be controlled as a function of an input signal into the RF power amplifier having varying amplitude.

BACKGROUND OF THE INVENTION

Radio frequency (RF) power amplifiers are used in a wide variety of communications and other electronic applications. These amplifiers are made up of one or more cascaded amplifier stages, each of which increases the level of the signal applied to the input of that stage by an amount known as the stage gain. Ideally, the input to output transfer of each stage is linear, i.e., a perfect replica of the input signal increased in amplitude appears at the amplifier output. In reality, however, all power amplifiers have a degree of non-linearity in their transfer characteristic. This non-linearity adversely affects various amplifier operating characteristics such as gain performance, intermodulation performance and efficiency.

Non-linear amplifier transfer characteristics give rise to a phenomenon, hereinafter referred to as gain expansion. Gain expansion is caused by the change in the amplifier's base-emitter voltage due to rectification of input signal power in the base-emitter junction. In effect, the input signal power to an RF amplifier changes the amplifier's quiescent operating point. As a result, an RF amplifier's gain will increase as a function of the input signal power, thereby giving rise to the gain expansion phenomenon. Gain expansion is typically an undesirable characteristic exhibited by RF power amplifiers. This is especially true when the amplifier must operate across a wide dynamic range of input signals, like the multi-tone linear power amplifiers disclosed in U.S. Pat. No. 5,307,022, entitled HIGH DYNAMIC RANGE MODULATION INDEPENDENT FEED FORWARD AMPLIFIER NETWORK and assigned to the assignee of the present application. In such multi-tone applications, constant amplifier gain over a wide dynamic range of input signals is required.

This same non-linearity causes distortion of the amplifier's output signal so that it is no longer a perfect replica of the input signal. This distortion produces spurious signal components known as intermodulation products. Intermodulation products are typically undesirable because they cause interference, cross talk, and other deleterious effects on the performance of a system employing the amplifier. Of note, the quantity of intermodulation products generated by the amplifier is directly proportional to the magnitude of the signal applied to the amplifier's input.

Yet another RF power amplifier operating characteristic hampered by non-linear transfers is the amplifier's efficiency. By definition, an amplifier's efficiency is determined by POUT/PIN. The more efficient an amplifier is, the less input power required to achieve a desirable output level. Since gain expansion tends to distort the amplifier's output power level, it has the undesirable effect of decreasing an amplifier's efficiency at low output powers.

Accordingly, the prior art reflects various methods and devices designed to improve one or more of the amplifier's operating characteristics, typically at the expense of others. As will be appreciated, optimizing for any one parameter adversely effects the others, since they are all closely inter-related. Thus, while biasing the amplifier's quiescent operating point low tends to improve the amplifier's efficiency, intermodulation performance and saturation point, it nonetheless compromises the maximum gain available and the amplifier's gain flatness (constant gain over wide dynamic range). Conversely, while biasing the amplifier's quiescent operating point higher tends to improve the maximum gain available and the amplifier's gain flatness, it nonetheless compromises the amplifier's efficiency, intermodulation performance and saturation point. In addition, one or more of the RF amplifier's operating performance characteristics may be affected by temperature. However, the above prior art requires additional circuitry for temperature compensation.

It would be extremely advantageous therefore to provide a compensation circuit capable of equalizing an RF power amplifier's operating characteristics over a wide dynamic range of inputs and over temperature, so that the RF power amplifier achieves optimum linearity while avoiding the shortcomings of the prior art. U.S. Pat. No. 5,311,143, entitled RF AMPLIFIER BIAS CONTROL METHOD AND APPARATUS discloses a bias control circuit that changes the appropriate bias point relative to the average power out of the RF power amplifier. However, this circuit requires multiple circuit components that can track the envelope of the input signal in order to change the bias point as a function of the envelope. Moreover, the circuit disclosed in U.S. Pat. No. 5,311,143 also requires additional circuitry for temperature compensation.

Thus, there exists a need for a simple space effective, power effective and cost efficient circuit that controls the bias point of an RF power amplifier as a function of the input signal and that also has the benefits of temperature compensation.

BRIEF DESCRIPTION OF THE FIGURES

A preferred embodiment of the invention is now described, by way of example only, with reference to the accompanying figures in which.

DETAILED DESCRIPTION OF THE PREFERRED EMBODIMENT

Figure 1:
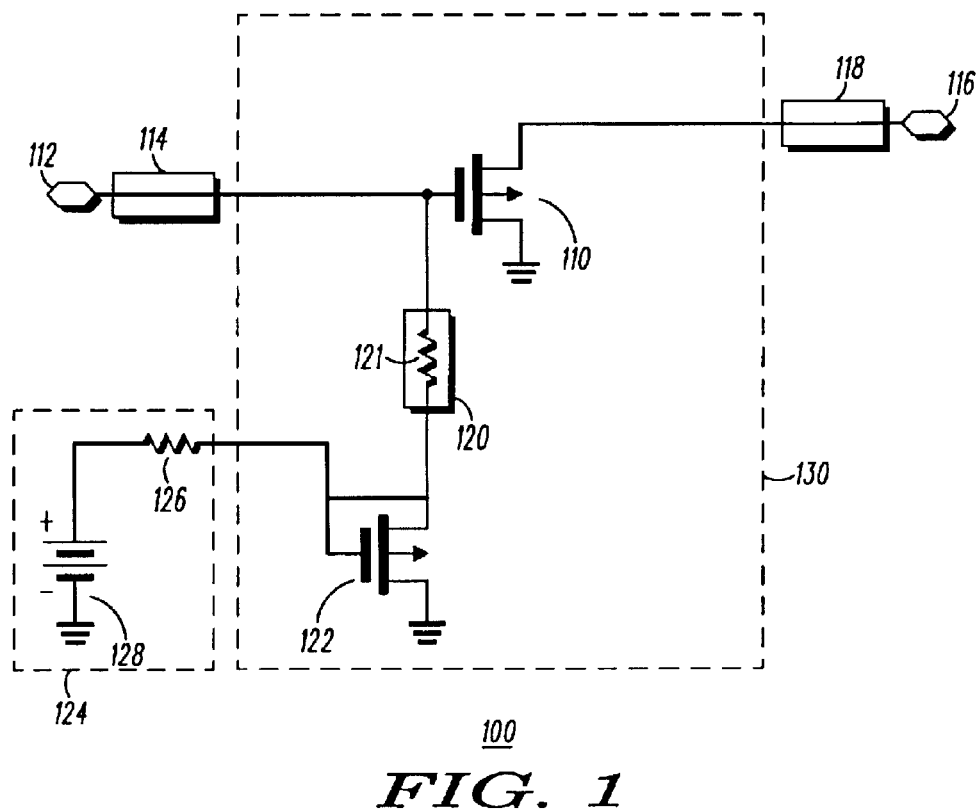
FIG. 1 illustrates a diagram of an RF power amplifier network in accordance with the present invention.

It will be appreciated that for simplicity and clarity of illustration, elements shown in the figures have not necessarily been drawn to scale. For example, the dimensions of some of the elements are exaggerated relative to each other. Further, where considered appropriate, reference numerals have been repeated among the figures to indicate corresponding elements.

Referring to FIG. 1, there is illustrated a diagram of a radio frequency (RF) power amplifier network 100 according to the present invention. Typically, but not necessarily, network 100 is a single stage in a power amplifier system used, for instance, in a communications device, wherein the power amplifier system comprises a plurality of cascaded power amplifier networks like the one illustrated in FIG. 1. Network 100 signaling preferably anticipates both narrow bandwidth modulated signals and wide bandwidth modulated signals, such as, for example, a Frequency Division Multiple Access (FDMA) format and/or a Code Division Multiple Access (CDMA) format. In addition to comprising multiple modulation formats, the anticipated signaling environment of RF power amplifier network 100 is further characterized by input signals that exhibit a wide and dynamic range of input power levels (or amplitudes).

Referring back to FIG. 1, RF power amplifier network 100 includes an RF power amplifier having a plurality of operating performance characteristics responsive to a quiescent operating point. The RF power amplifier comprises a transistor 110. Preferably, transistor 110 is a lateral double-diffused metal-oxide semiconductor (LDMOS) field effect transistor (FET) having its source coupled to a fixed voltage, preferably a ground potential. The RF power amplifier further comprises input port 112 for receiving the input signal, and, preferably, an input match circuit 114 coupled between input 112 and the gate of transistor 110 for effectively delivering the input power from the source load (not illustrated) to transistor 110. The RF power amplifier still further comprises an output port 116 and, preferably, an output match circuit 118 coupled between output 116 and the drain of transistor 110 for effectively delivering the output power from transistor 110 to an output load (not illustrated).

RF power amplifier network 100 further includes an adaptive bias control circuit according to the present invention. The bias control circuit comprises circuit 120 that is preferably coupled to the junction of the input match 114 and the gate of transistor 110. Preferably circuit 120 comprises a resistor 121. Circuit 120 may also instead comprise an inductor or some other similar, preferably, passive network that provides for the needed functionality. The bias control circuit further comprises a transistor 122 that is also, preferably, an LDMOS FET that is, preferably, a small fraction of the size of transistor 110, ideally 1/100 the size to be most effective in power consumption.

Transistor 122 is connected common gate, common drain, and its source is coupled to a fixed voltage, preferably a ground potential. Moreover, ideally the source of transistor 122 is coupled to a fixed voltage that is equal to or essentially the same as the fixed voltage coupled to the source of transistor 110. This is so that the two transistors are reasonably well matched for purposes of thermal tracking, which is discussed below in detail. The junction of the gate and drain of transistor 122 is further coupled to circuit 120. Finally the bias control circuit, preferably, further comprises a circuit 124. Circuit 124 preferably includes a resistor 126 and a DC voltage source 128 coupled in series to the junction of the gate and drain of transistor 122. However, those of ordinary skill in the art will realize that circuit 124 may comprise additional components for performing the same functionality.

RF power amplifier network 100 preferably functions as follows. Prior to the input signal being received into input port 112, resistor 126 and voltage source 128 are used to set a predetermined drain current through transistor 122. This drain current through transistor 122, in turn, causes a DC bias voltage, Vbias, to be coupled through circuit 120 to the gate of transistor 110 for setting the quiescent operating point of the RF power amplifier, which in the case of an LDMOS FET is established by a bias current $I_{DQ}$ into the drain of transistor 110. The values of resistor 126 and of voltage source 128 are selected to generate an $I_{DQ}$ that causes the RF power amplifier to be characterized in a particular class of operation. For instance, the RF power amplifier can be characterized as Class A. In that case, the values of resistor 126 and of voltage source 128 are, preferably, selected to cause the RF power amplifier to operate with optimal linearity.

As stated above, once the input signal begins to be received into input port 112, it may cause transistor 110 to exhibit some non-linearity, for instance, due to the input signal having varying amplitude. The bias control circuit compensates for such non-linearity by adjusting Vbias, the bias voltage on the gate of transistor 110, for controlling the bias current $I_{DQ}$ as a function of the amplitude of the input signal, for maintaining optimal linearity as the amplitude of the input signal changes. Specifically, circuit 120 causes a portion of the input signal (determined by the size of resistor 121) to be coupled to transistor 122. Transistor 122 rectifies this portion of the input signal, such that as the amplitude of the input signal increases, this causes transistor 122 to draw current and, thus, causes the bias voltage at the gate of transistor 110 to decrease, which decreases the bias current $I_{DQ}$. Conversely, as the amplitude of the input signal decreases, this causes transistor 122 to draw less current and, thus, causes the bias voltage at the gate of transistor 110 to increase, which increases the bias current $I_{DQ}$. In an LDMOS RF power amplifier, this is desirable because it is known that these type of amplifiers require a harder bias point at lower power out than at peak power out for optimal linearity operation. By adaptively controlling the bias point over the envelop of the input signal, an LDMOS power amplifier can be configured to have an optimal linearity condition over the envelope with overall efficiency improvement.

Figure 2:
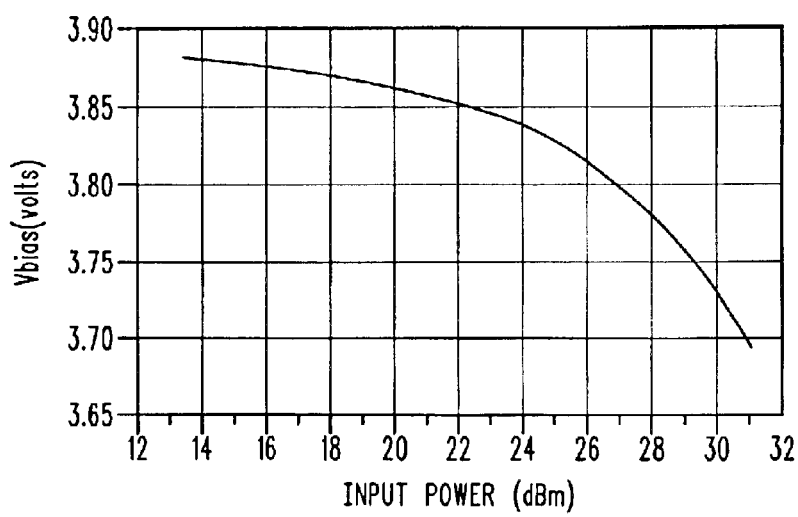
FIG. 2 illustrates the transfer function of the bias control circuit illustrated in FIG. 1.

FIG. 2 illustrates the transfer function of the adaptive bias control circuit illustrated in FIG. 1. FIG. 2 shows the decreasing bias voltage, Vbias, at the gate of transistor 110 as the power level at input port 112 increases, thereby adjusting the bias current $I_{DQ}$ as a function of the input power level in order to control the quiescent operating point of transistor 110 to optimize overall linearity and efficiency of transistor 110.

Preferably, many of the components of the RF power amplifier network 100 illustrated in FIG. 1 are housed in an integrated circuit (IC) chip. The dashed box 130 illustrates those components of RF power network 100 that are preferably on the same IC ship. Particularly transistor 110 is on the IC chip, and match circuits 114 and 118 may be either on- or off-chip. Preferably, circuit 120 and transistor 122 in the bias control circuit are also manufactured on the same IC chip with transistor 110. Having both transistor 110 and transistor 122 on the same IC chip enables the bias control circuit of FIG. 1 to also maintain the desired bias point fixed over temperature since transistor 122 will thermally track transistor 110 and appropriately change the bias voltage to transistor 110. The key to thermal tracking is that both transistors are on the same IC chip such that their thermal and electrical characteristics are essentially the same independent of temperature and process variations.

An advantage of the present invention is that it uses a FET in the adaptive bias control circuit, which is fast enough to track the envelope of the input signal, thereby eliminating the need for the more complex and expensive additional circuitry used in the prior art.

Another advantage of the present invention is that bias control in an RF power amplifier may be achieved using an adaptive bias control circuit having a single active element and a minimum of one additional passive element, which greatly decreases the cost of manufacturing the circuit compared to the prior art.

Yet another advantage of the present invention is that since the adaptive bias control circuit is, preferably, located on-chip with the RF power amplifier such that both the amplifier transistor and the bias control circuit transistor have the same electrical and thermal characteristics, the bias control circuit further provides for temperature compensation.

While the invention has been described in conjunction with specific embodiments thereof, additional advantages and modifications will readily occur to those skilled in the art. The invention, in its broader aspects, is therefore not limited to the specific details, representative apparatus, and illustrative examples shown and described. Various alterations, modifications and variations will be apparent to those skilled in the art in light of the foregoing description. For instance, those of ordinary skill in the art will realize that the present invention may be modified, wherein different types of transistors are used, including but not limited to Bipolar and Gallium Arsanide transistors, which also have similar linearity versus bias behavior as LDMOS FETs, or wherein the RF power amplifier transistor and the bias control circuit transistor are each a different type of transistor (if temperature considerations are not considered). Thus, it should be understood that the invention is not limited by the foregoing description, but embraces all such alterations, modifications and variations in accordance with the spirit and scope of the appended claims.

What is claimed is:

1. An adaptive bias control circuit for use with a radio frequency (RF) power amplifier, said RF power amplifier having an input for receiving an input signal having a varying amplitude, an output, a first transistor having a first, second and third terminal, and a plurality of operating performance characteristics responsive to a quiescent operating point established by a bias current in the RF power amplifier, said bias control circuit comprising:

a first circuit coupled to said RF power amplifier for receiving a portion of said input signal; and a second transistor for generating a rectified signal from said portion of the input signal, said rectified signal for causing said bias current to be controlled as a function of the amplitude of the input signal, said second transistor having a first and second terminal directly connected together and coupled to said first circuit and a third terminal coupled to a fixed voltage.

2. The adaptive bias control circuit of claim 1, wherein said second transistor is a fraction of the size of said first transistor.

3. The adaptive bias control circuit of claim 1, wherein said second transistor is configured to have essentially the same electrical and thermal characteristics as said first transistor.

4. The adaptive bias control circuit of claim 3, wherein said RF power amplifier is housed in an integrated circuit (IC) chip, and the second transistor is also housed in said IC chip for causing said first and second transistors to have essentially the same electrical and thermal characteristics.

5. The adaptive bias control circuit of claim 1, further comprising a second circuit coupled to said second transistor for initially biasing said second transistor and for causing said bias current to be set prior to said input signal being received.

6. The adaptive bias control circuit of claim 5, wherein said second circuit comprises a resistor and a voltage source connected in series.

7. The adaptive bias control circuit of claim 1, wherein said first and second transistors are lateral double-diffused metal-oxide semiconductor (LDMOS) transistors.

8. The adaptive bias control circuit of claim 7, wherein each said first terminal is a gate, each said second terminal is a drain, and each said third terminal is a source, such that said bias current is the drain current of said first transistor, said rectified signal is a DC current, and said rectified signal causes the voltage at the gate of said first transistor to be adjusted inversely to the amplitude of said input signal for controlling said bias current.

9. The adaptive bias control circuit of claim 1, wherein said first circuit comprises a resistor coupled between said RF power amplifier and the junction of the first and second terminals of said second transistor.

10. The adaptive bias control circuit of claim 1, wherein said first circuit comprises an inductor coupled between said RF power amplifier and the junction of the first and second terminals of said second transistor.

11. The adaptive bias control circuit of claim 1, wherein said fixed voltage is a ground potential.

12. An adaptive bias control circuit for use with a radio frequency (RF) power amplifier, said RF power amplifier having an input for receiving an input signal having a varying amplitude, an output, a first transistor, and a plurality of operating performance characteristics responsive to a quiescent operating point established by a bias current in the RF power amplifier. said bias control circuit comprising:

a first circuit coupled to said RF power amplifier for receiving a portion of said input signal; and a second transistor for generating a rectified signal from said portion of the input signal, said rectified signal for causing said bias current to be controlled as a function of the amplitude of the input signal, said second transistor having a first and second terminal directly connected together and coupled to said first circuit and a third terminal coupled to a ground potential, wherein said RF power amplifier is housed in an integrated circuit (IC) chip, and the second transistor is also housed in said IC chip for causing said first and second transistors to have essentially the same electrical and thermal characteristics.

13. A radio frequency (RF) power amplifier network for use in a communications device comprising:

an RF power amplifier configured for exhibiting a plurality of operating performance characteristics responsive to a quiescent operating point established by a bias current in the RF power amplifier, said RF power amplifier comprising an input for receiving an input signal having a varying amplitude, an output, and a first transistor coupled between said input and output; and an adaptive bias control circuit comprising a first circuit coupled to said RF power amplifier for receiving a portion of said input signal, and a second transistor for generating a rectified signal from said portion of the input signal, said rectified signal for causing said bias current to be controlled as a function of the amplitude of the input signal, said second transistor having a first and second terminal directly connected together and coupled to said first circuit and a third terminal coupled to a fixed voltage.

* * * * *